US006219246B1

(12) United States Patent
Edevold et al.

(10) Patent No.: US 6,219,246 B1
(45) Date of Patent: Apr. 17, 2001

(54) HEAT SINK APPARATUS

(75) Inventors: Craig Edevold, Tomah; Cary Winch, Necedah, both of WI (US)

(73) Assignee: Powerware Corporation, Raleigh, NC (US)

( * ) Notice: Subject to any disclaimer, the term of this patent is extended or adjusted under 35 U.S.C. 154(b) by 0 days.

(21) Appl. No.: 09/347,828

(22) Filed: Jul. 2, 1999

(51) Int. Cl.[7] ..................................................... H05H 7/20
(52) U.S. Cl. .................... 361/707; 165/80.2; 165/185; 174/16.3; 257/726; 361/690; 361/715
(58) Field of Search .................... 165/80.2, 80.3, 165/185; 174/16.3; 257/707, 713, 718–719, 725–727; 361/688, 690, 704, 707, 709, 710, 715, 719, 720

(56) References Cited

U.S. PATENT DOCUMENTS

| 4,701,829 | * | 10/1987 | Bricaud et al. | 361/704 |
|---|---|---|---|---|
| 4,872,089 | | 10/1989 | Ocken et al. | 361/388 |
| 4,899,255 | | 2/1990 | Case et al. | 361/386 |
| 4,972,294 | | 11/1990 | Moses, Jr. et al. | 361/686 |
| 4,979,073 | * | 12/1990 | Husted | 361/704 |
| 5,172,756 | * | 12/1992 | Jayamanne et al. | 165/80.3 |
| 5,343,362 | * | 8/1994 | Solberg | 361/710 |
| 5,461,541 | * | 10/1995 | Wentland, Jr. et al. | 361/707 |
| 5,864,464 | | 1/1999 | Lin | 361/697 |
| 5,875,097 | | 2/1999 | Amaro et al. | 361/704 |
| 5,886,870 | | 3/1999 | Omori | 361/704 |

* cited by examiner

Primary Examiner—Gregory Thompson
(74) Attorney, Agent, or Firm—Leydig, Voit & Mayer, Ltd.

(57) ABSTRACT

A heat sink apparatus for drawing heat from one or more devices and a method of attaching such a heat sink to one or more devices is provided. The heat sink includes a mounting surface, which draws heat into the heat sink where it is dissipated by fins. The heat sink can be mounted next to the device to be cooled with minimum insertion force since the weight of the heat sink is borne by the printed circuit board upon which the electronic device is installed. A rotatable cam is turned by the user, which engages a pivot arm. The pivot arm rotates a number of spring clips against the device thereby holding it in place. Once in a fully closed position, the cam locks into place to prevent the pivot arm and spring clips from rotating back to an open position. The spring clips affix the heat sink and maintains contact between the mounting surface and the device being cooled. The individually articulated spring clips allow the heat sink to be mounted over multiple devices of various dimensions and locations along the heat sink.

24 Claims, 2 Drawing Sheets

HEAT SINK APPARATUS

BACKGROUND OF THE INVENTION

The invention relates to heat sinks and a method of attaching a heat sink to a device in order to allow the heat sink to draw heat away from the device. In particular, the invention relates to a heat sink which can be mounted and dismounted with minimum insertion force and which has a resilient holding member for securing the heat sink to the device, and to a method of mounting the heat sink.

It is commonly known in the art to connect a heat sink to various mechanical or electrical machines or devices in order to draw heat away from the machine or device. Many electronic devices fail if the temperature of the device rises above a particular temperature. Specifically, integrated circuits, capacitors, power amplifiers and other electronic components generate heat as electric current passes through the component. That heat must be dissipated in order to allow the device to operate normally.

SUMMARY OF THE INVENTION

In the case of electrical devices such as integrated circuits that are soldered to a printed circuit board, commonly known methods of connecting a heat sink to the device often causes stress on the package or on the leads connecting the package to the printed circuit board.

Commonly known heat sink devices in the art require a high insertion force, a mounting surface external to the device being cooled or must be mounted prior to soldering the package to the circuit board. Exemplary devices are shown and described in U.S. Pat. No. 4,872,089, U.S. Pat. No. 4,899,255, U.S. Pat. No. 4,972,294, U.S. Pat. Nos. 5,864,464, 5,875,097, and U.S. Pat. No. 5,886,870.

Accordingly, the invention provides a heat sink apparatus for drawing heat away from a device, and means for connecting the heat sink apparatus to a device with minimal insertion force. In particular, the means for connecting the heat sink apparatus to the device includes a mounting surface and a resilient holding member pivotally connected to the mounting surface for adjustable movement between a clamped position and a released position. In a preferred embodiment, the heat sink further includes a cam with a cam engagement surface, a removable user-operated cam actuator connected to the cam and a holding member which includes a pivot aim and spring clips. Rotational movement of the cam actuator is translated into horizontal movement of the holding member between the clamped and released positions to secure and release, respectively, the heat sink from the device.

The use of individual spring clips allows the heat sink to be mounted to multiple devices of different styles, shapes and at different locations along the mounting surface. Individual spring clips which do not engage a device pivotally rotate towards the mounting surface, but do not become compressed and do not contribute to the clamping of the heat sink.

The invention also provides a method of securing a heat sink apparatus to a device, the heat sink apparatus having a resilient holding member and a mounting surface, the method including placing the heat sink on the device so that the device is positioned between the mounting surface and the resilient holding member and rotating the cam actuator, thereby moving the resilient holding member between the released position and the clamped position to secure the heat sink to the device. In a preferred embodiment the heat sink includes cooling fins to provide a greater surface area to dissipate heat into the surrounding air.

In an alternative embodiment the cooling capability of the cooling fins on the heat sink could be supplemented with a power-actuated fan. Such power-actuated fans are well known in the art. In an additional alternative embodiment, a temperature monitor could be installed on the heat sink to monitor and report the operating temperature of the heat sink, thereby indicating the relative internal operating temperature of the device. Inclusion of such a monitor would ensure that the device was operating within safe operational temperature parameters and would allow for user intervention prior to device failure. Such temperature monitors are well known in the art.

It is a principal advantage of the invention to provide a heat sink that can be secured to a device either before or after soldering the device to a printed circuit board without stressing the device or device leads during installation.

It is another advantage of the invention to provide a heat sink that can be removed from a device after mounting the heat sink to the device on a printed circuit board without stressing the device or device leads during heat sink removal.

It is another advantage of the invention to provide a heat sink capable of simultaneously clamping a plurality of devices of varying styles to the heat sink.

It is another advantage of the invention to provide a heat sink that does not require front access to the device to mount the heat sink to the device.

It is yet another advantage of the invention to provide a heat sink that can be secured to the device without any additional hardware or external mounting surfaces.

Various other features and advantages of the invention are set forth in the following detailed description, drawings and claims.

Figure 1:
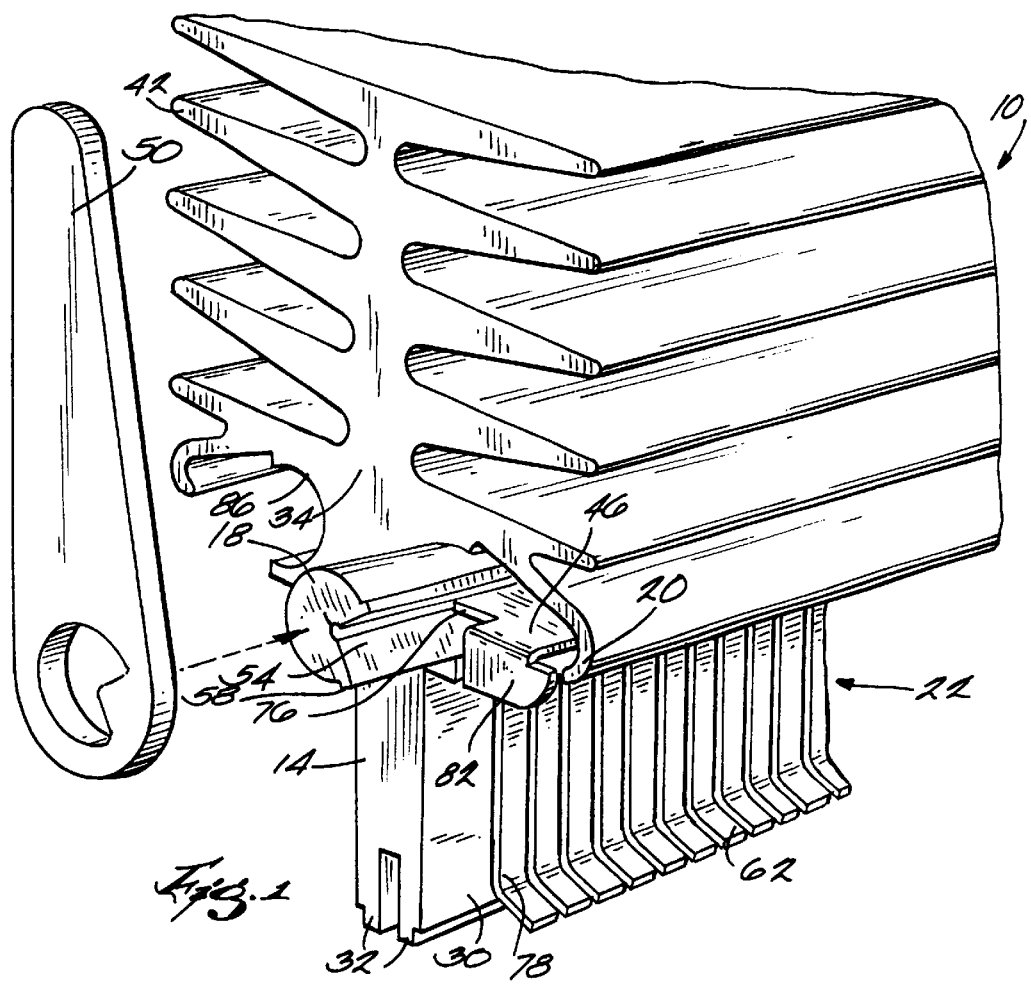
FIG. 1 is a partial perspective view of the heat sink apparatus embodying the invention, and showing a tool for operating the heat sink apparatus.

Before one embodiment of the invention is explained in detail, it is to be understood that the invention is not limited in its application to the details of the construction and the arrangements of the components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF THE PREFERRED EMBODIMENT

As seen in FIGS. 1 though 4 the heat sink apparatus 10 embodying the invention includes a body 14 and means for securing the heat sink apparatus 10 to a device to conduct heat away from the device. The means for securing includes a cam 18 and a holding member 22. The body 14 has a length which may be reduced or enlarged according to the application to accommodate any number of devices 26.

Figure 3:
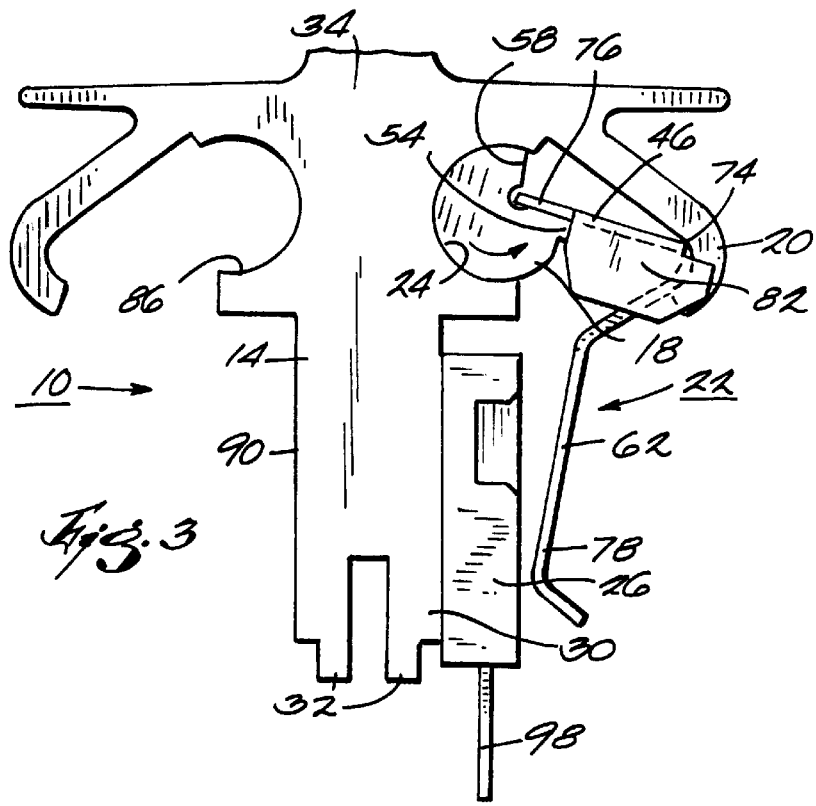
FIG. 3 is a view similar to FIG. 2 showing the heat sink apparatus positioned over a device.
Figure 4:
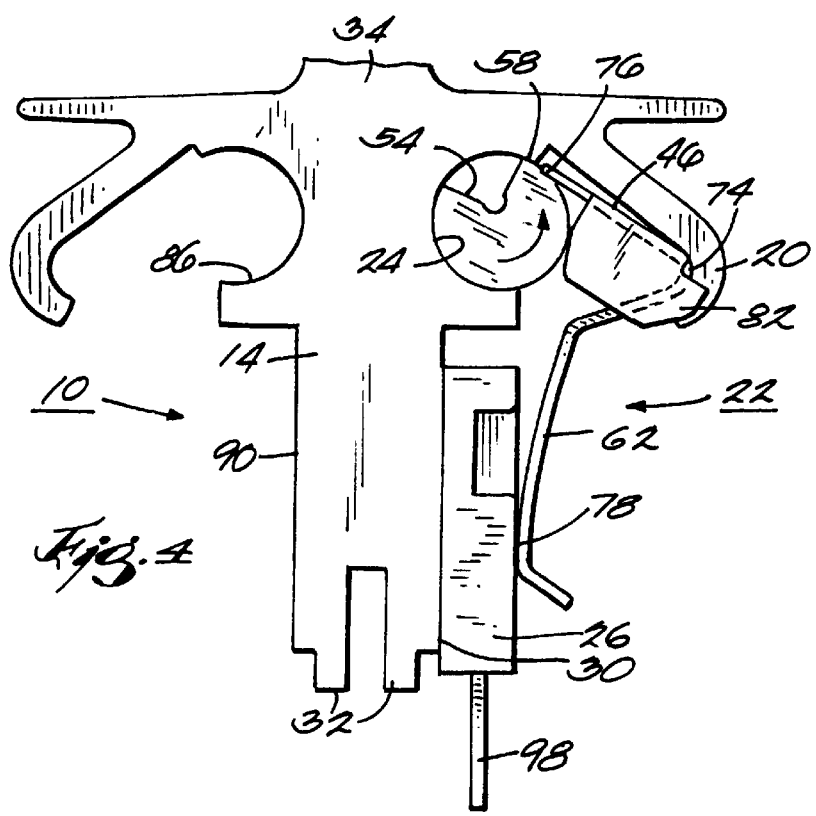
FIG. 4 is a view similar to FIG. 3 showing the heat sink apparatus positioned over the device and being clamped to the device.

The body 14 is preferably manufactured from a dense, thermally conductive material. The body 14 includes a mounting surface 30. As seen in FIGS. 3 and 4, the mounting surface 30 contacts the device 26 once the heat sink apparatus 10 is mounted adjacent to the device 26. In one embodiment, a thermally conductive, electrically insulating material is applied to the mounting surface before the heat sink is secured to the device. Typically, the thermally conductive, electrically insulating material is applied as an adhesively bonded sheet or label. Such materials are commonly commercially available. In other embodiments (not shown), the mounting surface is actually made from a thermally conductive, electrically insulating material.

The body 14 also includes a base 32. The base 32 provides a surface for supporting the heat sink apparatus 10 on a printed circuit board (not shown). As seen in FIG. 1, the base 32 of the body 14 is machined to provide a small surface area. In the embodiment depicted, the entire body 14 is machined, extruded or cast from single piece of aluminum.

The body 14 also includes a heat sink 34. The heat sink 34 is partially depicted in FIGS. 2 through 4 and more completely depicted in FIG. 1. As best seen in FIG. 4, the heat sink 34 includes a number of cooling fins 42 which extend from the body 14.

The body 14 also includes a cam channel 24. The cam channel 24 is a recess formed between the body 14 and the heat sink 34. The cam channel 24 extends along the entire length of the body 14, and is shaped to accommodate a cylindrical cam 18 pivotally mounted in the cam channel 24 for axial rotation.

As seen in FIG. 1, the cam 18 is a cylindrical member machined, extruded or cast to a length slightly longer than the body 14 of the heat sink apparatus 10. As seen in FIGS. 1 through 4, the cam 18 includes a V-shaped engagement surface 54 which runs the entire length of the cam 18.

The cam 18 also includes a grooved, recessed portion 58 which runs across the entire length of the cam 18. The portion 58 prevents reverse rotation of the cam 18 in the cam channel 24.

A portion of the cam 18 extends beyond the body 14 to provide an interface with a cam actuator 50. In the embodiment shown, the cam actuator 50 is a wrench having a socket designed to accept the cross-sectional shape of the cam 18. In the embodiment depicted, the cam 18 is machined, extruded or cast from a single piece if aluminum.

The heat sink apparatus 10 also includes a holding member retainer 20 connected to the body 14 and a holding member 22 mounted in the holding member retainer 20. Preferably, the holding member retainer 20 and holding member 22 extend along the length of the body 14.

The holding member 22 is a resilient member that mechanically biases the device 26 against the mounting surface 30. The holding member 22 is manufactured from a single, flat piece of metal pressed and formed into a curved shape to define a pivot arm 46 and a spring clip or clips 62 connected to the pivot arm 46 at a curved portion 74. In the embodiment shown, the holding member 22 is manufactured from stainless spring steel. The holding member 22 is pivotally movable in the cam channel 24 between a released position as shown in FIG. 3 and a clamped position as shown in FIG. 4.

Figure 2:
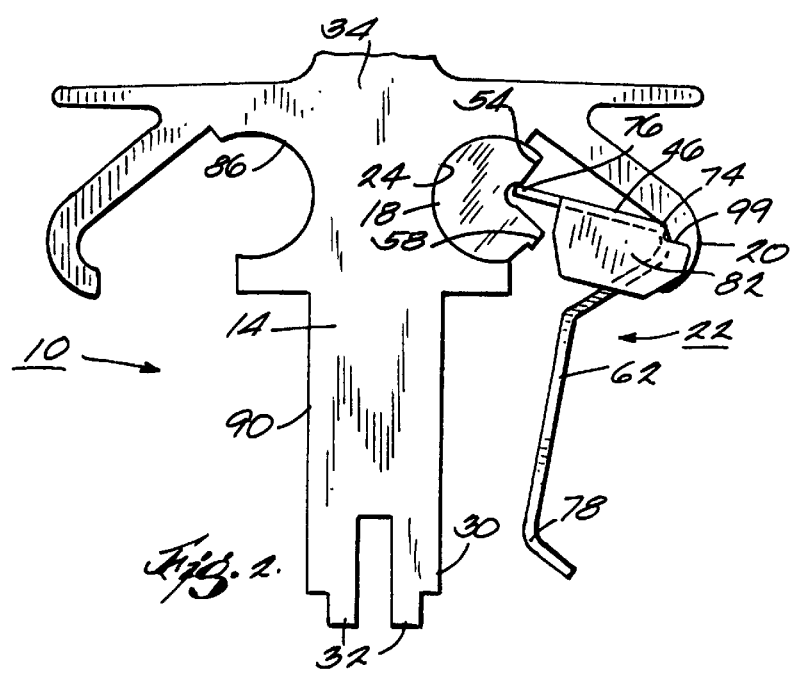
FIG. 2 is a side elevational view of the heat sink apparatus shown in FIG. 1.

Curved portion 74 engages pivot portion 99 of the inside of the cam channel 24 formed by the holding member retainer 20. As best depicted in FIG. 2, the pivot arm 46 includes an end 76 that extends into the vortex of the V-shaped engagement surface 54 of the cam 18.

As seen in FIGS. 1 though 4, the spring clips 62 extend beyond the cam channel 24 in spaced relation to the mounting surface 30. In the embodiment shown in the drawings, the ends of the spring clips 62 are slightly curved away from the mounting surface 30 to provide an engagement surface 78 with the device 26.

As shown in the drawings, the holding member includes a holding member stop 82 on each end of the pivot arm 46 of the holding member 22 to secure the holding member 22 in the cam channel 24. The holding member stop 82 is a flat piece of the pivot arm 46 formed perpendicular to the pivot arm 46. The holding member stop 82 provides a surface to engage the body 14 thereby securing the holding member 22 in the cam channel 24.

As seen in FIGS. 1 through 4, the heat sink apparatus 10 includes a second cam channel 86 and second mounting surface 90 to accommodate a second cam (not shown) and second holding member (not shown). The second cam (not shown) pivotally engages a second holding member (not shown) which engages a second device (not shown) in substantially the same method and manner as cam 18 and holding member 22.

In general, the method of mounting the heat sink to a device includes positioning the heat sink adjacent to the device, and biasing the holding member toward the mounting surface so as to clamp the device between the mounting surface of the heat sink and the holding member. The ability to secure the heat sink to a device by clamping the device between the mounting surface of the heat sink and the holding member reduces the risk that the thermally conductive, electrically insulating material will be damaged during installation of the heat sink.

More specifically, the heat sink apparatus 10 is supported on the printed circuit board (not shown) so that the device 26 is positioned between mounting surface 30 and holding member 22. The heat sink apparatus 10 is then secured to the device 26 by rotating the cam 18 with the cam actuator 50. As seen in FIG. 1, the cam actuator 50 has an opening or socket therein that is shaped to fit the cam 18. Turning again to FIGS. 3 and 4, rotation of the cam 18 causes the cam engagement surface 54 to engage the pivot arm 46 which rotates the pivot arm 46 inside the cam channel 24 thereby causing the holding member 22 to pivot into the clamped position (as seen in FIG. 4). Engagement of recessed portion 58 with end 76 of pivot arm 46 prevents release of said holding member 22 and reverse-rotation of the cam 18. The pivot arm 46 translates the rotational movement of the cam 18 into the clamping action of the holding member 22. The flexible spring clips 62 bias the device 26 against the mounting surface 30 so that heat generated by the device 26 is transferred to the body 14 to dissipated into the ambient environment by heat sink 34. With further rotation of the cam, the end 76 returns to the V-shaped surface 54 thereby returning the holding member 22 to the released position as shown in FIG. 2. The heat sink apparatus 10 can then be easily removed without stressing the device 26 or the device leads 98.

Mounting the heat sink apparatus 10 in the manner described above ensures maximum contact and thermal transfer between the mounting surface 30 and the device 26 thereby allowing heat generated by the device 26 to be conducted through the mounting surface 30 and body 14 into the heat sink 34 and away from the device 26. In the embodiment depicted, the mounting surface 30 and heat sink 34 provide a dense material to conduct thermal energy away from the device 26 while the cooling fins 42 provide a greater surface area for the heat sink 34 to dissipate the heat into the surrounding air.

In other embodiments (not shown), the heat sink may include means for sensing the temperature of the heat sink or of the device. Such means may include any type of known temperature sensor, and this sensor may be connected to a control circuit for operating a cooling fan. Triggering of the control circuit by the temperature sensor causes operation of the fan to blow cooling air over the heat sink to further facilitate cooling of the device.

Various features and advantages of the invention are set forth in the following claims.

What is claimed is:

1. A heat sink apparatus for dissipating heat generated by a device, comprising:
    a thermally conductive body having a mounting surface, a holding member retainer, and defining a cam channel therein;
    a holding member pivotally mounted in relation to said holding member retainer, said holding member defining a pivot arm portion and a spring clip portion; and
    a cam rotatably mounted within said cam channel, said cam defining therein a V-shaped engagement surface adapted to receive said pivot arm portion of said holding member in a disengaged position wherein said spring clip portion of said holding member is positioned a maximum distance from said mounting surface; and
    wherein rotation of said cam in a first direction pivots said pivot arm portion into an engaged position wherein said spring clip portion is positioned at a minimum distance from said mounting surface in a quiescent state.

2. The apparatus of claim 1, wherein said cam further defines a recessed portion adapted to engage an end of said pivot arm in said engaged position, and wherein said recessed portion prevents rotation of said cam in a direction opposite said first direction.

3. The apparatus of claim 1, wherein said spring clip portion is flexible in said engaged position to accommodate devices of different sizes.

4. The apparatus of claim 3, wherein said holding member includes a curved portion between said pivot arm portion and said spring clip portion, said curved portion accommodating said flexiblility of said spring clip portion in relation to said pivot arm portion.

5. The apparatus of claim 1, wherein said holding member further comprises a holding member stop positioned to engage said cam in said engaged position to maintain said holding member in place.

6. The apparatus of claim 1, wherein said body further includes a base formed to support a weight of said apparatus.

7. The apparatus of claim 1, wherein said base has a small surface area to minimize heat transfer therethrough.

8. The apparatus of claim 1, wherein said cam includes a portion extending beyond said body, said apparatus further comprising a cam actuator having a socket adapted to accept a cross-sectional shape of said cam, said cam actuator engaging said portion of said cam extending beyond said body and operable to impart rotation thereto.

9. The apparatus of claim 8, wherein said cam actuator is a wrench removable from said cam.

10. The apparatus of claim 1, wherein said holding member is formed such that said pivot arm portion and said spring clip portion are positioned in approximate perpendicular relation.

11. The apparatus of claim 10, wherein rotation of said cam imparts movement to said pivot arm in a direction relatively away from said mounting surface, and to said spring clip portion in a direction relatively toward said mounting surface.

12. A heat sink apparatus, comprising:
    a body having a mounting surface;
    a flexible holding member having a first portion forming a spring clip and a second portion forming a pivot arm; and
    a cam rotatably positioned within a cam chamber formed by said body; and
    wherein rotation of said cam in a first direction transitions said holding member between a disengaged position and an engaged position, said cam defining a recessed portion in an outer surface thereof adapted to engage said pivot arm in said engaged position thereby preventing rotation of said cam in a second direction opposite to said first direction.

13. The apparatus of claim 12, wherein said cam defines therein a V-shaped engagement surface adapted to receive said pivot arm in said disengaged position.

14. The apparatus of claim 12, wherein said holding member further includes a curved portion between said pivot arm and said spring clip, wherein said body further includes a holding member retainer, and wherein said curved portion provides a pivotal coupling to said holding member retainer.

15. The apparatus of claim 14, wherein said pivot arm and said spring clip are formed in an approximately perpendicular relationship to one another.

16. The apparatus of claim 15, wherein rotation of said cam in said first direction imparts movement of said spring clip from said disengaged position at a first distance from said mounting surface to said engaged position at a second distance from said mounting surface, said first distance being greater than said second distance.

17. The apparatus of claim 12, wherein rotation of said cam in said first direction from said disengaged position to said engaged position transitions said pivot arm through a first arc of a first angle, and wherein said spring clip is flexible such that an angle of a second arc through which said spring clip is transitioned is at most equal to said angle of said first arc.

18. The apparatus of claim 17, having an external device is positioned between said mounting surface and said spring clip, wherein said angle of said second arc is less than said angle of said first arc.

19. The apparatus of claim 12, wherein said body includes a base having a small contact surface area to minimize heat transfer thereat.

20. The apparatus of claim 12, further comprising a cam actuator removably coupled to said cam.

21. The apparatus of claim 20, wherein said cam includes a portion extending beyond said body, and wherein said cam actuator includes a socket adapted to engage a cross-sectional shape of said cam.

22. The apparatus of claim 1, wherein said holding mechanism further includes a holding member stop positioned to engage an outer surface of said cam in said engaged position.

23. A heat sink apparatus comprising a body having a mounting surface adapted to provide thermal contact to a device, and a holding member adapted to provide a clamping force to hold the device in close contact with the mounting surface, the holding member including a pivot arm portion adapted to engage a rotatable cam positioned in said body, said cam positioning said holding member in an engaged and a disengaged position upon rotation thereof, said holding member further defining a flexible spring clip portion adapted to accommodate devices of different sizes in said engaged position.

24. The heat sink of claim 23, wherein the cam includes a portion adapted to engage said pivot arm to prevent movement from said engaged to said disengaged positions by reverse rotation of said cam.

* * * * *

UNITED STATES PATENT AND TRADEMARK OFFICE
CERTIFICATE OF CORRECTION

PATENT NO. : 6,219,246 B1
DATED : April 17, 2001
INVENTOR(S) : Edevold et al.

It is certified that error appears in the above-identified patent and that said Letters Patent is hereby corrected as shown below:

<u>Column 6,</u>
Lines 59-62, delete "claim 22" and substitute therefor Claim 22 as follows:
-- 22. The apparatus of claim 12, wherein said holding member further includes a holding member stop positioned to engage an outer surface of said cam in said engaged position. --

Signed and Sealed this

Second Day of April, 2002

Attest:

JAMES E. ROGAN
*Director of the United States Patent and Trademark Office*

*Attesting Officer*